(12) United States Patent
Joo et al.

(10) Patent No.: US 7,816,670 B2
(45) Date of Patent: Oct. 19, 2010

(54) ORGANIC MEMORY DEVICE AND FABRICATION METHOD THEREOF

(75) Inventors: Won Jae Joo, Hwaseong-si (KR); Tae Lim Choi, Seongnam-si (KR); Sang Kyun Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 912 days.

(21) Appl. No.: 11/606,892

(22) Filed: Dec. 1, 2006

(65) Prior Publication Data

US 2007/0267627 A1 Nov. 22, 2007

(30) Foreign Application Priority Data

May 22, 2006 (KR) ...................... 10-2006-0045624

(51) Int. Cl.
*H01L 29/08* (2006.01)
(52) U.S. Cl. .......... 257/40; 257/E51.031; 257/E51.041; 438/99
(58) Field of Classification Search .................... 257/40, 257/E51.031, E51.041; 438/99
See application file for complete search history.

(56) References Cited

U.S. PATENT DOCUMENTS

| | | | | |
|---|---|---|---|---|
| 5,883,397 A | * | 3/1999 | Isoda et al. .................... 257/40 |
| 7,199,394 B2 | * | 4/2007 | Mandell et al. ................ 257/40 |
| 7,221,599 B1 | * | 5/2007 | Gaun et al. ............... 365/49.15 |
| 7,307,338 B1 | * | 12/2007 | Mandell et al. ............. 257/643 |
| 7,405,167 B2 | * | 7/2008 | Kang et al. .................. 438/780 |
| 2002/0163057 A1 | | 11/2002 | Bulovic et al. |
| 2004/0027849 A1 | | 2/2004 | Yang et al. |
| 2006/0245235 A1 | * | 11/2006 | Krieger et al. ............... 365/115 |
| 2007/0176172 A1 | * | 8/2007 | Joo et al. ....................... 257/40 |
| 2007/0176189 A1 | * | 8/2007 | Joo et al. ....................... 257/90 |

FOREIGN PATENT DOCUMENTS

JP 62-095882 5/1987

OTHER PUBLICATIONS

Y. Segui et al., "Switching In Polystyrene Films: Transition From On To Off State" J. APPL. PHYS., vol. 47, No. 1, Jan. 1976.

* cited by examiner

*Primary Examiner*—Trung Dang
(74) *Attorney, Agent, or Firm*—Harness, Dickey & Pierce, P.L.C.

(57) ABSTRACT

An organic memory device and a method for fabricating the memory device are provided. The organic memory device may include a first electrode, a second electrode, and an ion transfer layer between the first electrode and the second electrode. The organic memory device may have lower operating voltage and current, and may be fabricated at lower costs.

20 Claims, 4 Drawing Sheets

ORGANIC MEMORY DEVICE AND FABRICATION METHOD THEREOF

PRIORITY STATEMENT

This non-provisional application claims the benefit of priority under 35 U.S.C. §119 to Korean Patent Application No. 2006-45624, filed on May 22, 2006, in the Korean Intellectual Property Office (KIPO), the entire contents of which are herein incorporated by reference.

BACKGROUND

1. Field

Example embodiments relate to an organic memory device and a method for fabricating the memory device. Other example embodiments relate to an organic memory device including an ion transfer layer formed between a first electrode and a second electrode, and a method for fabricating the organic memory device.

2. Description of the Related Art

Recent developments in data compression and transmission technologies have led to increased use of digital media. Under such circumstances, types of electronic devices, including mobile terminals, smart cards, electronic money, digital cameras, game memories, MP3 players and/or multimedia players are continuously being developed. Because development of these electronic devices requires an increase in the amount of data that may be stored in memory devices, demand for a variety of memory devices has been increasing. With growing use of portable digital devices, memory devices may be required to ensure non-volatility so that written data is not erased even when the power is cut off.

Most currently available nonvolatile memories are flash memories based on silicon materials. However, silicon-based memory devices have fundamental physical limitations. Conventional flash memories have technical limitations in that the number of writing/erasing cycles is limited, the writing speed is slower, the production costs of memory chips are increased due to additional microprocessing for higher density of memory capacity, and chips may not be miniaturized any further due to technical difficulties.

In view of these technical limitations of conventional flash memories, efforts have been made to develop next-generation nonvolatile memory devices that overcome physical limitations of the conventional silicon-based memory devices and have the advantages of higher speed, higher capacity, lower power consumption and lower price. Next-generation memories may be divided into ferroelectric RAMs, magnetic RAMs, phase change RAMs, nanotube memories, holographic memories and/or organic memories, depending on constituent materials of cells, which are basic internal units of semiconductors.

Of these, organic memories may be devices including a memory layer formed of an organic material between an upper electrode and a lower electrode wherein memory characteristics are realized by using bistability of resistance values obtained when a voltage is applied between the upper and lower electrodes. According to the organic memories, bistability characteristics may be provided by cells formed at intersections between the upper and lower electrodes. The organic memories are devices wherein resistance values of the organic material present between the upper and lower electrodes may be reversibly varied by electrical signals so that data, e.g. "0" and "1", may be written and read. Such organic memories have attracted much attention in recent years as next-generation memories because they may realize non-volatility, which is an advantage of conventional flash memories, and at the same time, may overcome the disadvantages of lower processability, higher fabrication costs and a lower degree of integration.

The conventional art includes an organic memory using 7,7,8,8-tetracyano-p-quinodimethane (CuTCNQ), which is an organometallic charge transfer complex compound. Further, a conventional semiconductor device may include an upper electrode, a lower electrode and an intermediate layer formed therebetween wherein the intermediate layer may be formed of a mixture of an ionic salt, e.g., NaCl and/or CsCl, and an electrically conductive polymer.

Further, a conventional organic memory device may include organic active layers and a metal nanocluster applied between the organic active layers. However, the problems of the device are that the yield is lower and the metal nanocluster is not uniformly formed.

On the other hand, metal filament memories are currently being investigated as structures of memories. According to the metal filament memories, resistance values may be varied by the formation and short-circuiting of metal filaments within an organic active layer between two electrodes. The advantages of such metal filament memories are lower price, possible three-dimensional stacking structures, longer retention time, improved thermal stability, and applicability to flexible memory devices. For example, polystyrene films formed from styrene vapor by a glow discharge polymerization technique are known to show memory characteristics due to the formation of metal filaments. However, no metal filaments may be formed within polystyrene films formed by a coating technique, e.g., spin coating.

Because the conventional metal filament memories include an organic active layer formed by vacuum evaporation, the fabrication processing may be complicated and considerable fabrication costs may be incurred. In addition, the problems of the conventional metal filament memories may be higher operating voltage and relatively difficult control of on/off current ratio.

SUMMARY

Example embodiments provide an organic memory device that may be fabricated in a simpler and economical manner without the use of an expensive electrically conductive polymer, has lower operating voltage and current, and may retain written data for a long period of time. Example embodiments provide a method for fabricating an organic memory device by a simplified procedure at reduced costs.

In accordance with example embodiments, an organic memory device may include a first electrode, a second electrode and an ion transfer layer between the first electrode and the second electrode.

The configuration of the example embodiments of the ion transfer layer of the organic memory device may be formed using a solution of a polymer, a copolymer or higher order polymer, a single molecule, an oligomer, a dendrimer and mixtures thereof having an electrical conductivity not greater than about $10^{-12}$ S/cm and capable of carrying metal ions in a solvent. As the polymer, there may be used, for example, a homopolymer, a copolymer and/or a mixture of different polymers. Specific examples of such polymers may include poly(4-vinylpyridine), poly(2-vinylpyridine), polyvinylpyrrolidone, polyallylamine, polyethylene amine, polyacrylamide, polyamidoamine and/or polyimide.

In accordance with example embodiments, a method for fabricating an organic memory device may include forming an ion transfer layer on a first electrode overlying a substrate, and forming a second electrode so as to be in contact with the ion transfer layer.

BRIEF DESCRIPTION OF THE DRAWINGS

Example embodiments will be more clearly understood from the following detailed description taken in conjunction with the accompanying drawings. FIGS. 1-5 represent non-limiting, example embodiments as described herein.

FIG. 1 is a diagram of an organic memory device according to example embodiments;

FIG. 2 is an equivalent circuit diagram of the organic memory device shown in FIG. 1;

FIG. 4 is a graph showing changes in current in response to a voltage applied to an organic memory device fabricated in Example 1; and FIG. 5 is a graph showing changes in the resistance of an organic memory device fabricated in Example 1 with the passage of time.

DESCRIPTION OF EXAMPLE EMBODIMENTS

Figure 1:
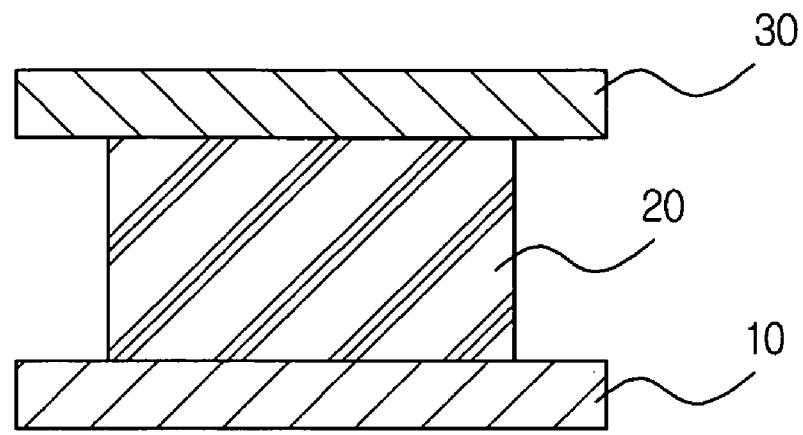

Various example embodiments will now be described more fully with reference to the accompanying drawings in which some example embodiments are shown. In the drawings, the thicknesses of layers and regions may be exaggerated for clarity.

Detailed illustrative example embodiments are disclosed herein. However, specific structural and functional details disclosed herein are merely representative for purposes of describing example embodiments. Example embodiments may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of example embodiments.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects of example embodiments will be described in detail with reference to the attached drawings. However, example embodiments are not limited to example embodiments described. Example embodiments will now be described in greater detail with reference to the accompanying drawings.

The organic memory device of example embodiments may include a first electrode, a second electrode, and an ion transfer layer, in which metal ions may be transferred, between the first electrode and the second electrode.

The ion transfer layer may be formed of a heteroatom-containing organic material having a lower electrical conductivity. When a voltage is applied to both electrodes of the final memory device, metal ions may be diffused from the second electrode into the ion transfer layer, which performs the same functions as a solid electrolyte. Metal ions may freely travel within the ion transfer layer to carry a current.

FIG. 1 is a diagram of an organic memory device according to example embodiments. With reference to FIG. 1, the organic memory device of example embodiments may include a first electrode 10, a second electrode 30 and an ion transfer layer 20 therebetween. The resistance values of the ion transfer layer 20 obtained when a voltage is applied to the memory device may exhibit bistability, thus achieving memory characteristics of the memory device. The memory characteristics may be attributed to the characteristics of an organic material constituting the ion transfer layer. Accordingly, the memory characteristics may be maintained even when power is cut off, thus ensuring non-volatility of the memory device.

The memory device of example embodiments may be provided in the form of a memory matrix, which may be formed on a suitable substrate, e.g., a glass and/or silicon substrate. In the memory matrix, common word lines may be formed so that data may be stored, erased, read and written in a plurality of multiple cell structures.

The ion transfer layer 20 may be formed of an organic material having an electrical conductivity not greater than about $10^{-12}$ S/cm. The configuration of the example embodiments of the organic materials that may be used in forming the ion transfer layer may include polymers, copolymers or higher order polymers, single molecules, oligomers, dendrimers and mixtures thereof. The ion transfer layer 20 may be formed of, for example, a polymer selected from homopolymers, copolymers and/or mixtures of different polymers. Specific examples of polymers may include, but are not limited to, poly(2-vinylpyridine), poly(4-vinylpyridine), polyvinylpyrrolidone, polyallylamine, polyethylene amine, polyacrylamide, polyamidoamine and/or polyimide.

The ion transfer layer 20 may be formed of the polyamidoamine dendrimer of Formula 1 below:

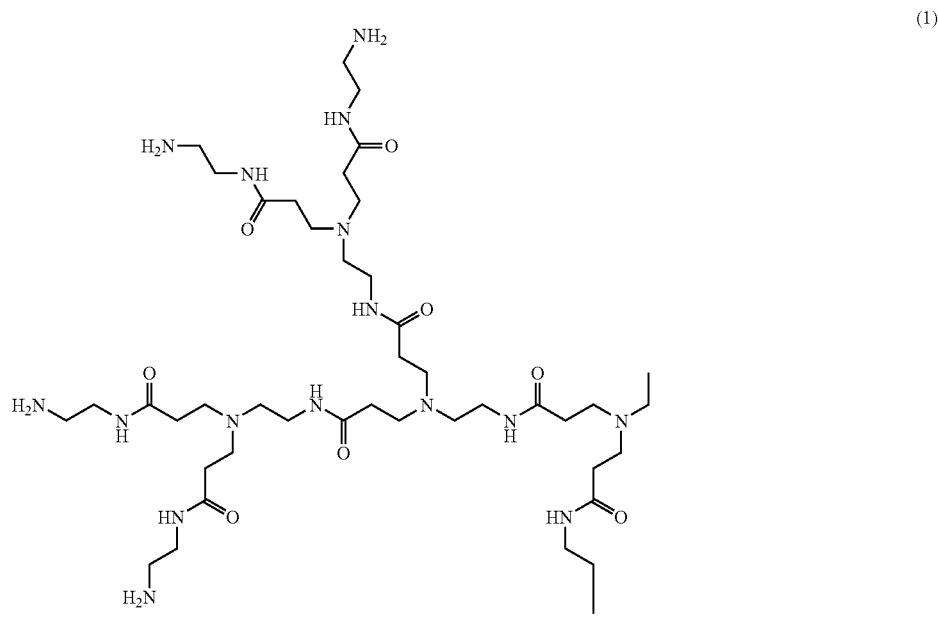

(1)

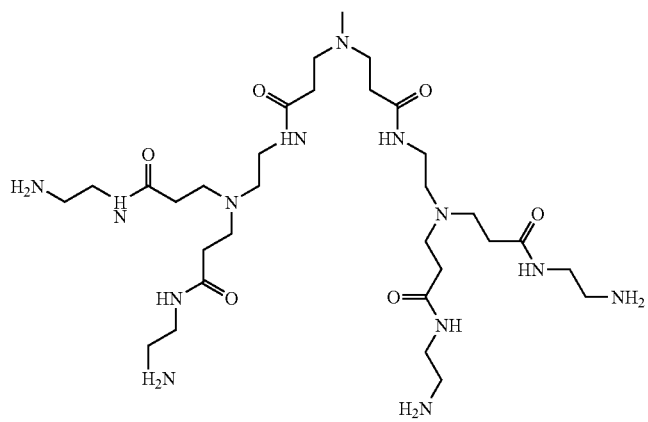

-continued

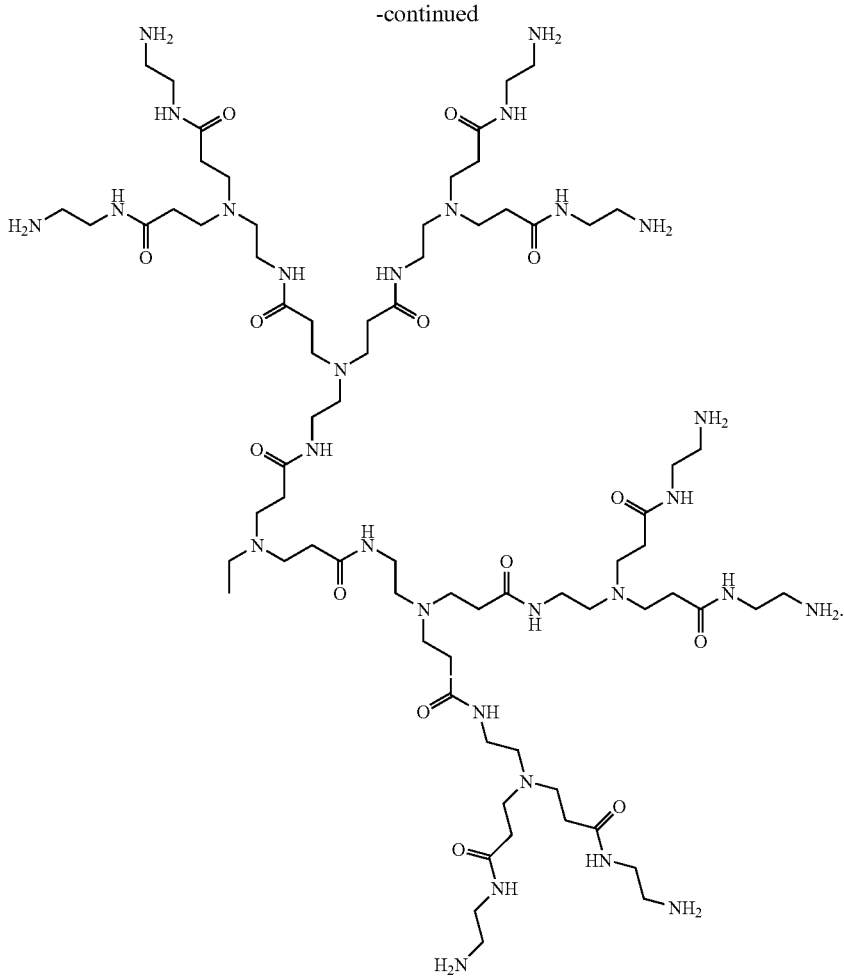

Any single molecule may be used to form the ion transfer layer 20 if it contains at least one heteroatom or has an electrical conductivity not greater than $10^{-12}$ S/cm. For example, the ion transfer layer 20 may be formed of a single molecule selected from the group consisting of bipyridine, pyridine, ethylene diamine, pyrrolidone, cyclam, porphyrin, phthalocyanine and/or derivatives thereof. The ion transfer layer may be linked to an electrode and a diode. The diode may be a P—N diode and/or a Schottky diode.

The first electrode 10 and the second electrode 30 may be made of at least one electrically conductive material selected from the group consisting of, but not limited to, gold, silver, platinum, copper, cobalt, nickel, tin, aluminum, indium tin oxide, titanium and/or combinations thereof. It may be necessary to form the first electrode 10, from which metal ions are diffused, using a highly diffusive metal. Non-limiting examples of such highly diffusive metals may include gold, silver, platinum, copper, cobalt, nickel, tin and/or aluminum.

The first electrode 10 may be made of at least one electrically conductive material selected from the group consisting of metals, metal alloys, metal nitrides, metal oxides, metal sulfides, carbon polymers, conductive polymers and/or organic conductors. Specific examples of materials for the first electrode may include, but are not limited to, tungsten (W), WN, Ti, TiN, TiAlN, TiSiN, Ta, TaN, TaSiN, Ni, Cr, Ru, $RuO_2$, RuSiN, Ir, $IrO_2$, ITO, aluminum (Al) and/or indium tin oxide (ITO).

Specific examples of conductive polymers that may be used to form the first electrode include phenylacetylene polymers, e.g., polydiphenylacetylene, poly(t-butyl)diphenylacetylene, poly(trifluoromethyl)diphenylacetylene, poly(bistrifluoromethyl)acetylene, polybis(t-butyldiphenyl)acetylene, poly(trimethylsilyl) diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsilyl)phenylacetylene and/or derivatives thereof and/or thiophene polymers.

The second electrode 30 may be made of copper and/or silver and/or the first electrode 10 may be made of aluminum, titanium and/or indium tin oxide. The organic memory device of example embodiments may be fabricated on a substrate. As the substrate, a common organic and/or inorganic substrate may be used. A flexible substrate may also be used. Glass, silicon, surface-modified glass, polypropylene and/or activated acrylamide may be used as a material for the substrate.

The organic memory device of example embodiments may have a lower operating voltage lower than about 5 volts and a higher on/off current ratio. The retention time of the organic memory device according to example embodiments may be prolonged by controlling metal-organic complex binding energy of the organic memory device. According to the hard-soft acid-base principle, it may be known that a hard acidic material strongly binds to a hard base and a soft acid strongly binds to a soft base to form respective complexes. The binding energy may be controlled by varying the bases according to the kind of metals to be used. Resistance states, stored in a combination of the complexes in which the acids are strongly bound to the corresponding bases, may be expected to be maintained for a prolonged period of time.

Figure 2:
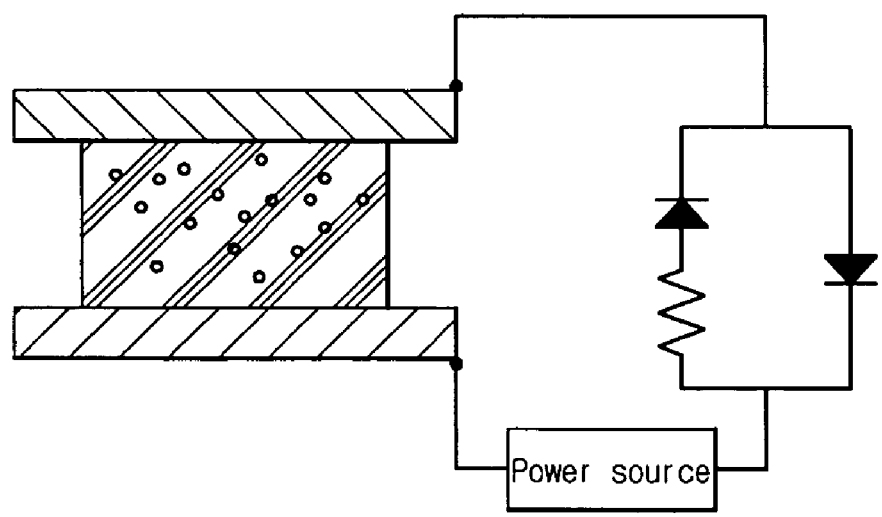

FIG. 2 is an equivalent circuit diagram illustrating the switching of the organic memory device shown in FIG. 1. One electrode of the organic memory device according to example embodiments may be ground, and the other electrode may be connected to an input power supply through a load resistor. The circuit may include an additional element (e.g., an external resistor) to control the resistance of the organic memory device when switched.

Figure 3A:
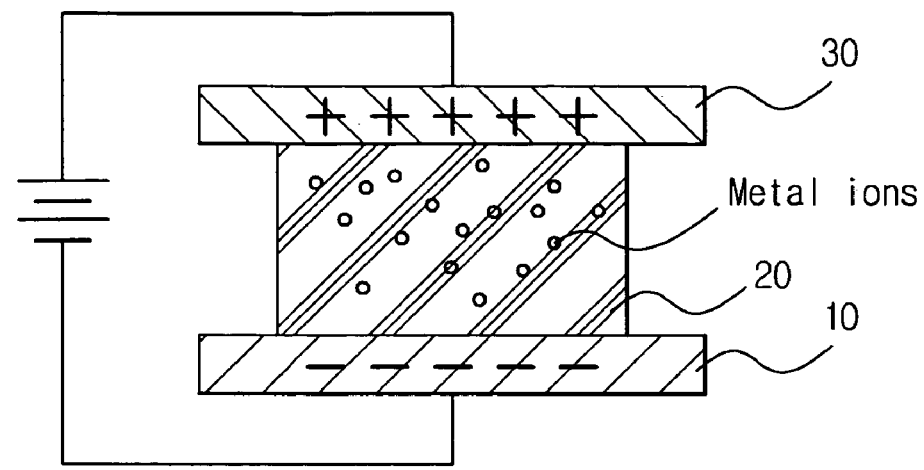
FIGS. 3a and 3b are diagrams illustrating the operational principle of an organic memory device according to example embodiments.
Figure 3B:
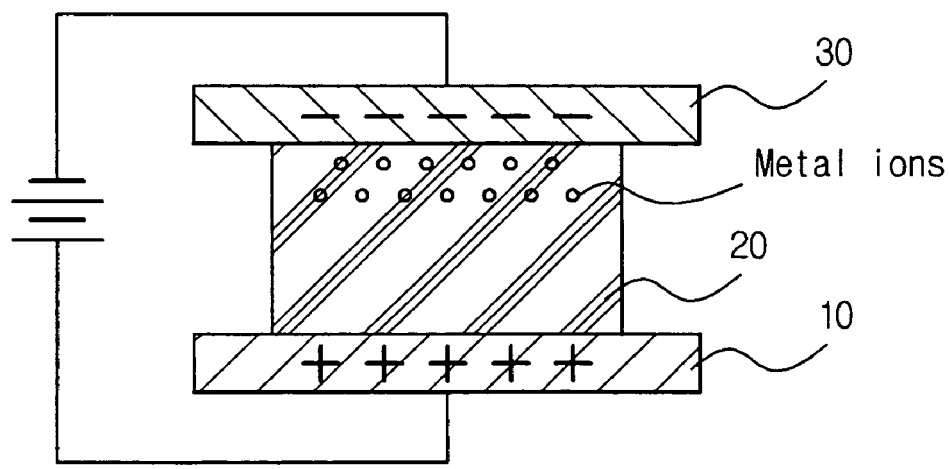

Although the switching and memory phenomena of the memory device according to example embodiments are not clearly established, the following assumption may be considered. FIGS. 3a and 3b are diagrams illustrating the operational principle of the organic memory device according to example embodiments.

When a voltage larger than the positive critical value as a first voltage pulse is applied to the organic memory device in an 'OFF' state, the constituent metal of the second electrode 30 may be ionized and the resulting metal ions may be diffused into the ion transfer layer 20. The presence of large amounts of the metal ions in the constituent organic material of the ion transfer layer 20 may lower the total resistance of unit cells. Alternatively, some or all of the desired metal ions may be incorporated in the ion transfer layer that is applied to the second electrode to form the ion transfer layer, thereby reducing or eliminating the need for metal ion diffusion from the second electrode.

The metal ions may be coordinated to the heteroatoms (N, O and/or S atoms) of the organic material, and they may remain in the coordinated state for a longer amount of time. As a result, the organic memory device of example embodiments may be turned to an 'ON' state where the electrical conductivity of the ion transfer layer 20 increases.

On the other hand, when a voltage smaller than the negative critical value as a second voltage pulse is applied to the organic memory device, the metal ions present in the ion transfer layer 20 may migrate toward the second electrode 30. Sites where the metal ions are deficient may be formed in the vicinity of the interface between the first electrode 10 and the ion transfer layer 20. Because the electrical conductivity at the metal-ion deficient sites is lower, the electrical conductivity of the organic memory device may be decreased. As a result, the organic memory device may again be switched to an 'OFF' state.

In conclusion, when a proper voltage is applied between the two electrodes of the organic memory device according to example embodiments, the ion transfer layer may switch between a higher resistance state and a lower resistance state. The state wherein the metal ions are uniformly diffused in the ion transfer layer 20 formed between the first electrode 10 and the second electrode 30 may become a lower resistance set state, and the state wherein the metal ions migrate toward the first electrode 10 may become a higher resistance reset state. Assuming that the lower resistance state is defined as data "1" and the higher resistance state is defined as data "0", two logic states of the data may be stored.

Example embodiments are directed to a method for fabricating the organic memory device. Specifically, the method of example embodiments may include forming an ion transfer layer on a first electrode overlying a substrate, and forming a second electrode to be in contact with the ion transfer layer. When a voltage is applied to both electrodes of the memory device, metal ions may be diffused from the second electrode into the ion transfer layer, and as a result, the ion transfer layer may act as a solid electrolyte layer in which the metal ions are diffused.

According to the method of example embodiments, the ion transfer layer may be formed by a simpler technique, e.g., spin casting, without involving a higher-cost technique, e.g., electron beam deposition, in terms of processing and materials. Specifically, the memory device of example embodiments may be fabricated by the following procedure. A first electrode may be coated with an electrically conductive material. A composition including an organic material having a lower electrical conductivity may be coated on the first electrode to form an ion transfer layer, and then a second electrode may be formed on the ion transfer layer, thus completing the fabrication of the final memory device.

Coating processes for the formation of the ion transfer layer are not particularly limited, and examples thereof may include spin coating, spray coating, electrostatic coating, dip coating, blade coating, roll coating and/or ink-jet printing. The ion transfer layer 20 may have a thickness of about 50 Å to about 3,000 Å.

At least one solvent selected from the group consisting of water, chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, acetonitrile and mixtures thereof may be used to form the ion transfer layer by spin coating. A solvent system or solvent mixture of two or more of the solvents in any miscible ratio may also be used.

The ion transfer layer between the first electrode and the second electrode may be formed into a monolayer and/or a multilayer consisting of two or more layers. Where the ion transfer layer has a multilayer structure, compositions for the respective layers may be identical to or different from each other. The first electrode and the second electrode may be formed by known coating processes, including deposition, e.g., thermal evaporation, sputtering, e-beam evaporation and/or spin coating.

Hereinafter, example embodiments will be explained in more detail with reference to the following examples. However, these examples are given for the purpose of illustration and are not to be construed as limiting the scope of example embodiments.

EXAMPLES

Example 1

Aluminum was deposited to a thickness of about 80 nm on a glass substrate by thermal evaporation to form a lower electrode, followed by patterning of the lower electrode. A solution of a mixture (about 0.5 wt %) of poly(4-vinylpyridine) and poly(2-vinylpyridine) in chloroform was spin-coated at about 1,500 rpm on the patterned lower electrode, and baked at about 110° C. for about 30 minutes to form an ion transfer layer. Subsequently, copper was deposited to a thickness of about 80 nm on the ion transfer layer by thermal evaporation to form an upper electrode, completing fabrication of a test organic memory device of example embodiments. The thickness of the ion transfer layer was controlled to about 30 nm to about 100 nm, as measured using an Alpha-Step profilometer. The thicknesses of the deposited electrodes were controlled using a quartz crystal monitor.

Example 2

Aluminum was deposited to a thickness of about 80 nm on a glass substrate by thermal evaporation to form a lower electrode, followed by patterning of the lower electrode. A methanolic solution of the PAMAM dendrimer (2 wt %) of Formula 1) was spin-coated at about 800 rpm on the patterned lower electrode, and baked at about 110° C. for about 30 minutes to form an ion transfer layer. Subsequently, copper was deposited to a thickness of about 80 nm on the ion transfer layer by thermal evaporation to form an upper electrode, completing fabrication of a test organic memory device of example embodiments. The thickness of the ion transfer layer was controlled to about 30 nm to about 100 nm, as measured using an Alpha-Step profilometer. The thicknesses of the deposited electrodes were controlled using a quartz crystal monitor.

Test Example 1

A. Test for Switching Characteristics of Memory Devices

Figure 4:
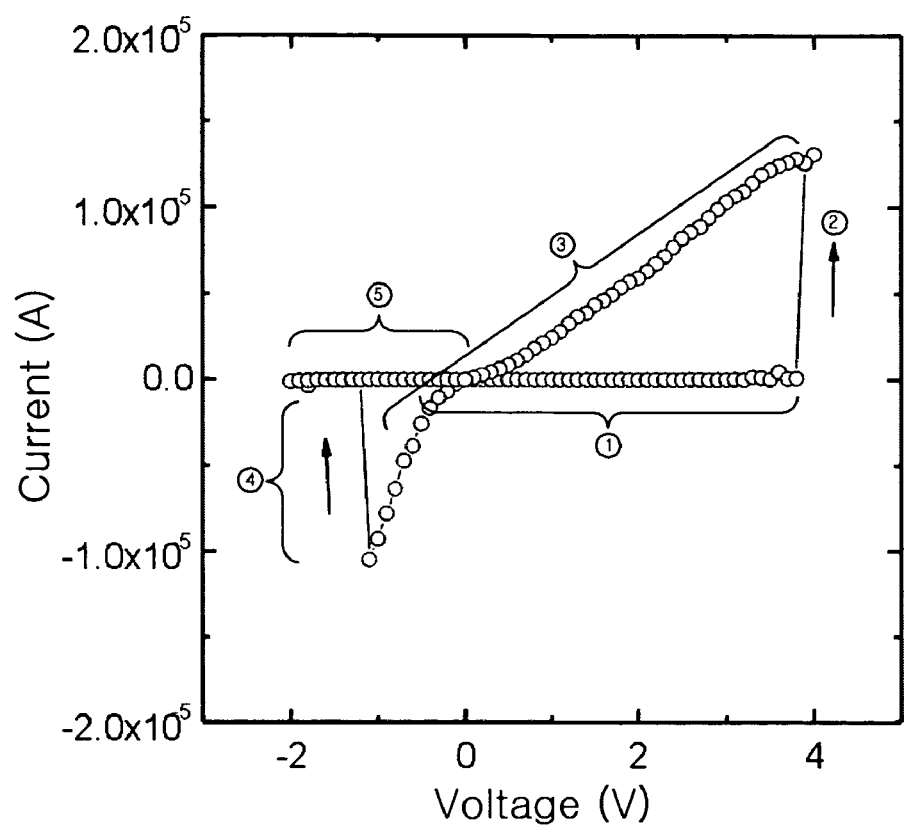

A voltage was applied to both electrodes of the organic memory device fabricated in Example 1 to evaluate the switching characteristics as changes in current. The results are shown in FIG. 4. As is evident from the graph shown in FIG. 1, the organic memory device, which was fabricated using an organic material having an electrical-conductivity of about $10^{-12}$ S/cm or less, was switched between a higher resistance state and a lower resistance state in response to the voltage applied to the device.

In the graph shown in FIG. 4, the abscissa represents the voltage applied between the first electrode (negative electrode) and the second electrode (positive electrode), the ordinate represents a current flowing through the ion transfer layer. The current-voltage characteristics shown in FIG. 4 indicate that the organic memory device of example embodiments showed hysteresis characteristics. Immediately after the fabrication, the organic memory device had a lower electrical conductivity and was in an 'OFF' state. The organic memory device was in an 'OFF' state at a voltage lower than about 3.8 V ('①' in FIG. 4).

When a voltage higher than about 3.8 V was applied, a current flowing through the ion transfer layer was increased and the organic memory device was turned to an 'ON' state where the electrical conductivity of the ion transfer layer increased ('②' in FIG. 4). When the applied voltage was lowered to about zero, the current was decreased linearly ('③' in FIG. 4). When the applied voltage was lowered to about –1 V, the resistance was slightly decreased, resulting in an increase in the current slope, which is due to the fact that the application of a negative voltage results in the disappearance of an external resistance, unlike the application of a positive voltage ('④' in FIG. 4). Switching in resistance was observed at a voltage of about –1 V, leading to a higher resistance state of the organic memory device ('⑤' in FIG. 4), and thereafter, the higher resistance of the organic memory device was maintained.

According to the organic memory device of example embodiments, each of the two different resistance states may be maintained for a longer period of time even when no voltage or current was applied to the memory device. In addition, because the resistance states may be read by detecting a current flowing when a lower voltage is applied, the device of example embodiments may be useful as a memory device. It may be confirmed that the organic memory device of example embodiments, which may include an ion transfer layer formed of a heteroatom-containing organic material having a lower electrical conductivity, may be fabricated by a simpler technique, e.g., spin casting, at lower costs, and showed improved switching characteristics.

B. Data Retention Time of Memory Device

Thermal degradation may be the most important factor limiting the service life and reliability of non-volatile memory devices and may be an important property in determining the data retention, which implies the storage of data for a desired time period, and the memory performance, which is evaluated as a leakage current.

Figure 5:
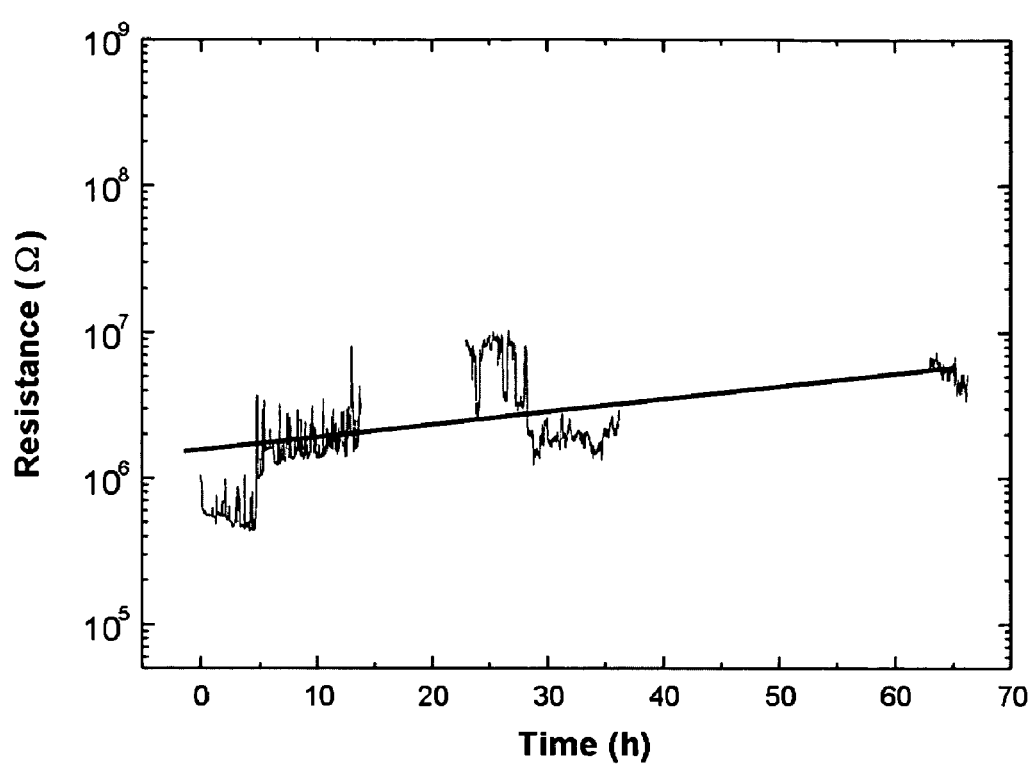

The retention time of the memory device was determined by observing the variations in pulse shape in response to an input signal with the passage of time when a positive and/or negative voltage was applied between the first electrode and the second electrode of the organic memory device at a constant temperature. The obtained results are graphically shown in FIG. 5. The graph shown in FIG. 5 demonstrates that the switching phenomenon of the organic memory device according to example embodiments was stably maintained even after about 70 hours, indicating that the organic memory device showed outstanding data storage capability.

As apparent from the foregoing, the organic memory device of example embodiments may be fabricated by simpler and economical processes, e.g., spin casting. In addition, the organic memory device of example embodiments may have the advantages of lower operating voltage and higher on/off current ratio.

Furthermore, because the organic memory device of example embodiments exhibits improved thermal stability and satisfactory non-volatility, it may be well suited for use in nonvolatile large-capacity storage units. Flexible electrodes may be used in the organic memory device of example embodiments to fabricate flexible memory devices.

Although example embodiments have been disclosed for illustrative purposes, those skilled in the art will appreciate that various modifications and variations are possible, without departing from the scope and spirit of the appended claims. Accordingly, such modifications and variations are intended to come within the scope of the claims.

What is claimed is:

1. An organic memory device, comprising:
    a first electrode;
    a second electrode; and
    an ion transfer layer between the first electrode and the second electrode,
    wherein the ion transfer layer is formed of an organic material having an electrical conductivity not greater than about $10^{-12}$ S/cm.

2. The organic memory device according to claim 1, wherein the organic material is a polymer, a copolymer or higher order polymer, a single molecule, an oligomer, a dendrimer and mixtures thereof.

3. The organic memory device according to claim 2, wherein the polymer is a homopolymer, a copolymer, or a mixture of different polymers.

4. The organic memory device according to claim 2, wherein the polymer is selected from the group consisting of poly(2-vinylpyridine), poly(4-vinylpyridine), polyvinylpyrrolidone, polyallylamine, polyethylene amine, polyacrylamide, polyamidoamine, and polyimide.

5. The organic memory device according to claim 2, wherein the dendrimer is the polyamidoamine dendrimer of Formula 1 below:

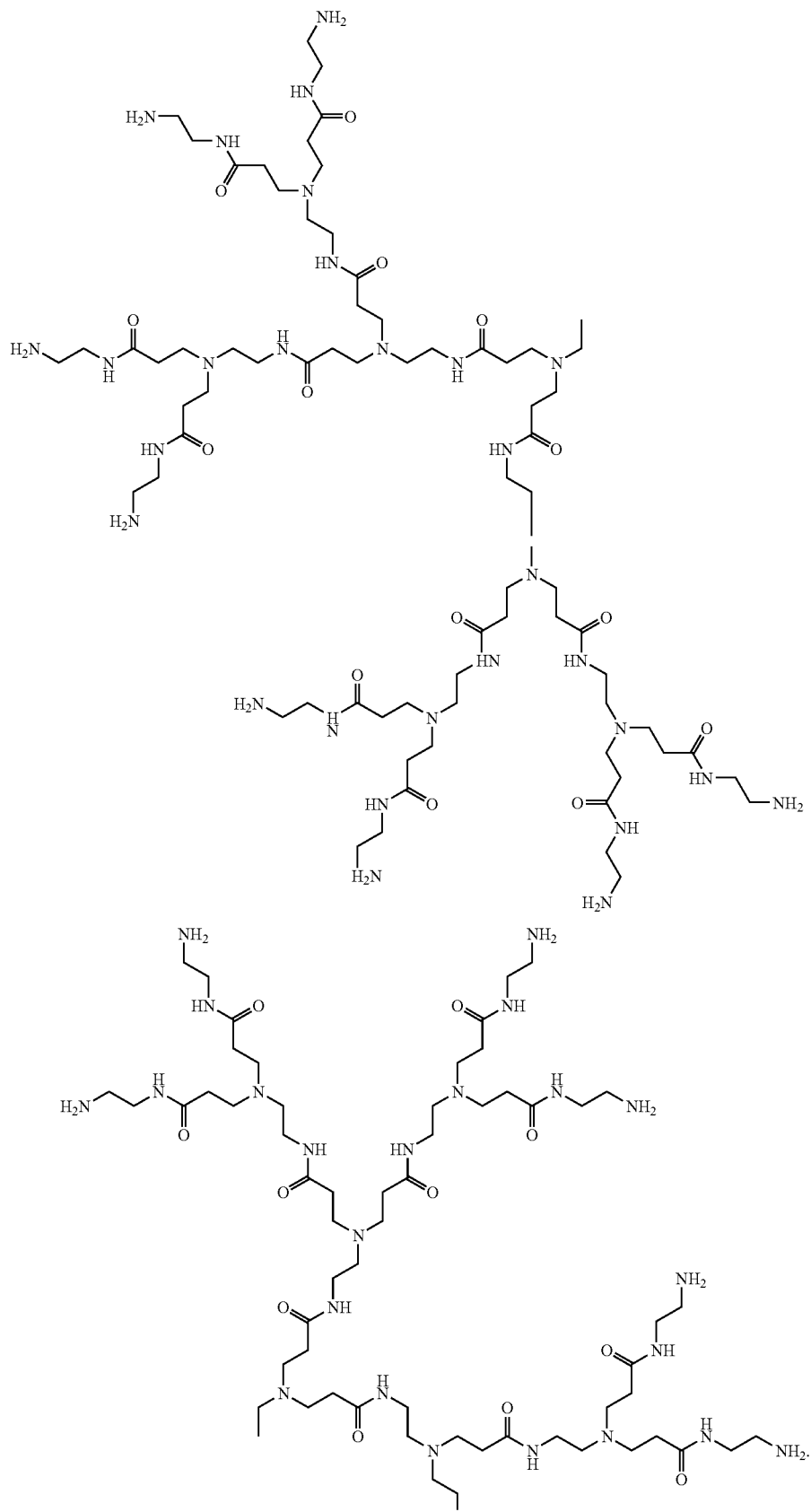
(1)

-continued

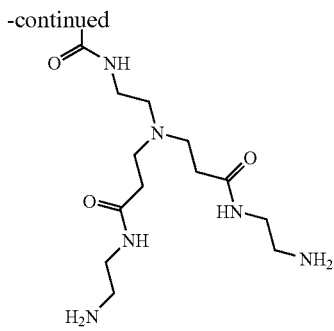

6. The organic memory device according to claim 2, wherein the single molecule is selected from the group consisting of bipyridine, pyridine, ethylene diamine, pyrrolidone, cyclam, porphyrin, phthalocyanine, and derivatives thereof.

7. The organic memory device according to claim 1, wherein either the first electrode or the second electrode is made of a material selected from the group consisting of gold, silver, platinum, copper, cobalt, nickel, tin, aluminum, indium tin oxide, titanium, and combinations thereof.

8. The organic memory device according to claim 1, wherein the first electrode is made of a material selected from the group consisting of tungsten (W), WN, Ti, TiN, TiAlN, TiSiN, Ta, TaN, TaSiN, Ni, Cr, Ru, $RuO_2$, RuSiN, Ir, $IrO_2$, ITO, aluminum (Al) and indium tin oxide (ITO) and the second electrode is made of a material selected from the group consisting of gold, silver, platinum, copper, cobalt, nickel, tin, and aluminum.

9. The organic memory device according to claim 1, wherein the ion transfer layer is linked to an electrode and a diode.

10. The organic memory device according to claim 9, wherein the diode is a P-N diode or a Schottky diode.

11. A method for fabricating an organic memory device, comprising:
    forming an ion transfer layer on a first electrode overlying a substrate; and
    forming a second electrode to be in contact with the ion transfer layer,
    wherein the ion transfer layer is formed of an organic material having an electrical conductivity not greater than about $10^{-12}$ S/cm.

12. The method according to claim 11, further comprising:
    applying a voltage to both electrodes of the memory device to diffuse metal ions from the second electrode into the ion transfer layer, thereby allowing the ion transfer layer to act as a solid electrolyte layer in which the metal ions are diffused.

13. The method according to claim 11, wherein the ion transfer layer is formed by coating a solution of the organic material capable of carrying metal ions in a solvent.

14. The method according to claim 13, wherein the organic material is a polymer, a copolymer or higher order polymer, a single molecule, an oligomer, a dendrimer and mixtures thereof.

15. The method according to claim 14, wherein the polymer is a homopolymer, a copolymer, or a mixture of different polymers.

16. The method according to claim 14, wherein the polymer is selected from the group consisting of poly(2-vinylpyridine), poly(4-vinylpyridine), polyvinylpyrrolidone, polyallylamine, polyethylene amine, polyacrylamide, polyamidoamine, and polyimide.

17. The method according to claim 14, wherein the dendrimer is the polyamidoamine dendrimer of Formula 1 below:

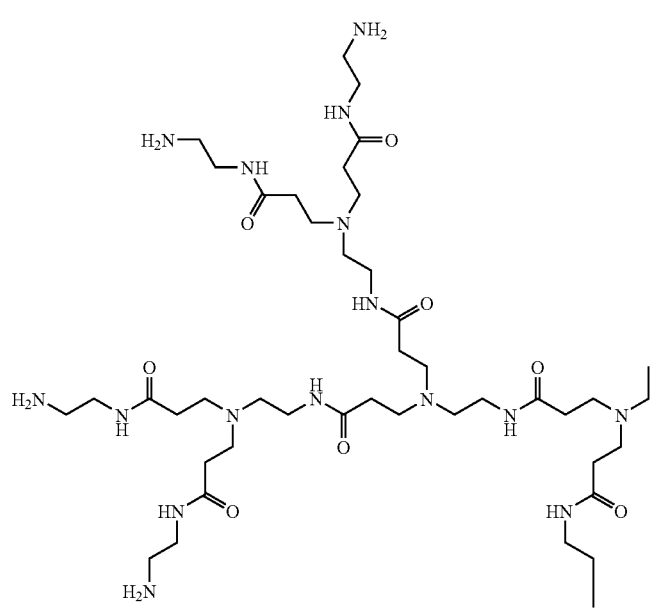

(1)

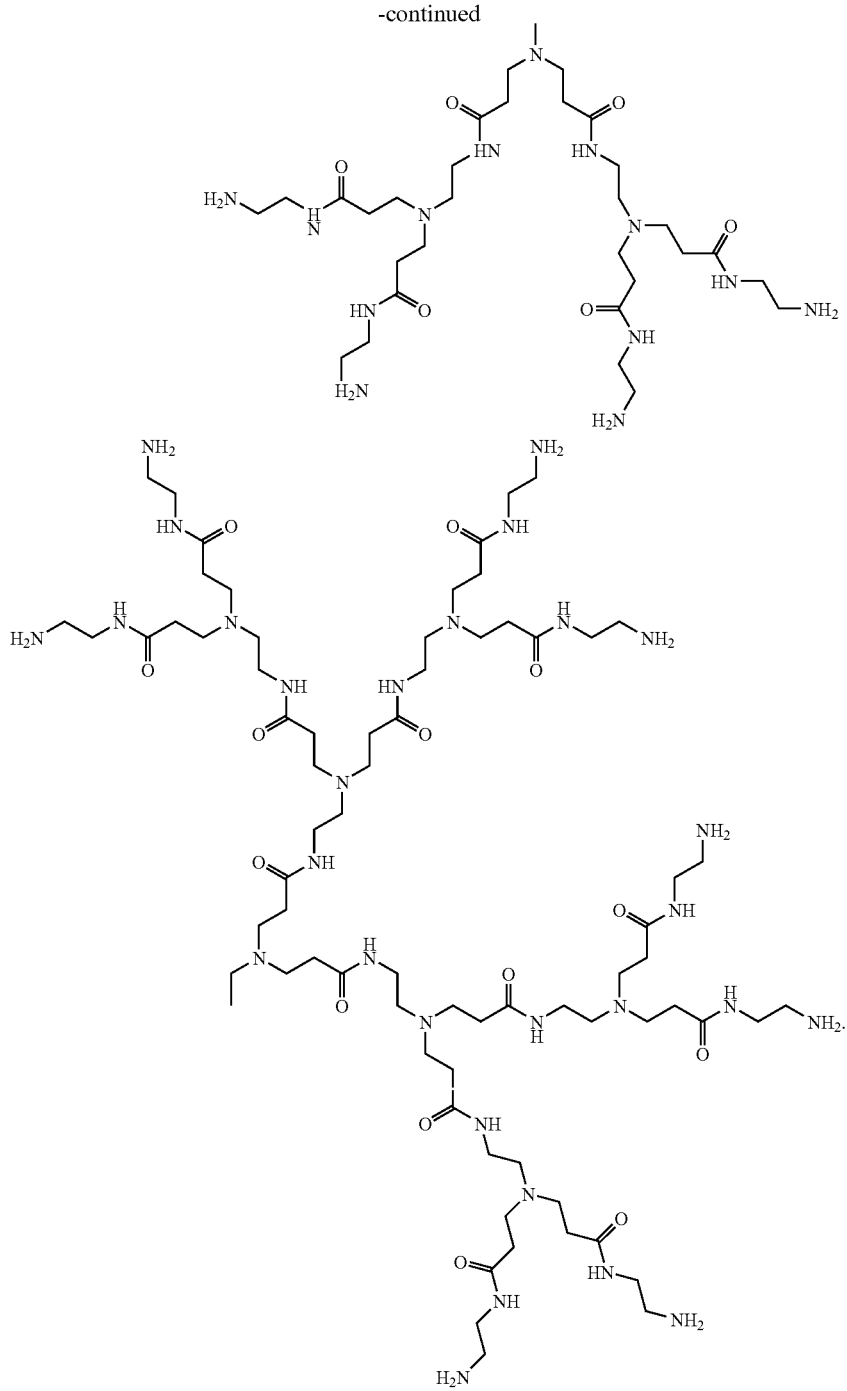

18. The method according to claim 14, wherein the single molecule is selected from the group consisting of bipyridine, pyridine, ethylene diamine, pyrrolidone, cyclam, porphyrin, phthalocyanine, and derivatives thereof.

19. The method according to claim 13, wherein the coating is carried out by a coating process selected from the group consisting of spin coating, spray coating, electrostatic coating, dip coating, blade coating, and roll coating.

20. The method according to claim 13, wherein the solvent is selected from the group consisting of water, chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, acetonitrile, and mixtures thereof.

* * * * *